(12) United States Patent
Singh et al.

(10) Patent No.: US 9,299,419 B1
(45) Date of Patent: Mar. 29, 2016

(54) SYSTEM AND METHOD FOR DYNAMICALLY ADJUSTING MEMORY RAIL VOLTAGE

(71) Applicant: QUALCOMM Incorporated, San Diego, CA (US)

(72) Inventors: Harmander Singh, Austin, TX (US); Milena Vratonjic, Santa Clara, CA (US); Ian David O'Donnell, San Jose, CA (US); Kenneth Gainey, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/611,482

(22) Filed: Feb. 2, 2015

(51) Int. Cl.
G11C 5/14 (2006.01)
G11C 11/00 (2006.01)
G11C 11/417 (2006.01)
G11C 5/00 (2006.01)

(52) U.S. Cl.
CPC .............. *G11C 11/417* (2013.01); *G11C 5/005* (2013.01); *G11C 5/14* (2013.01); *G11C 5/147* (2013.01)

(58) Field of Classification Search
CPC ....................................................... G11C 5/005
USPC ........................................................... 365/227
See application file for complete search history.

(56) References Cited

U.S. PATENT DOCUMENTS

| 6,597,620 B1 * | 7/2003 | McMinn .................. G11C 7/20 365/227 |
| 7,110,317 B2 * | 9/2006 | Song ..................... G11C 11/417 365/154 |
| 7,400,545 B2 * | 7/2008 | Ramaraju ............ G11C 11/413 365/154 |
| 7,936,589 B2 | 5/2011 | Houston |
| 7,978,503 B2 | 7/2011 | Koike et al. |
| 8,077,493 B2 | 12/2011 | Katayama |
| 8,193,792 B2 | 6/2012 | Kluge et al. |
| 8,305,831 B2 * | 11/2012 | Lee ....................... G11C 11/413 365/227 |
| 8,355,277 B2 * | 1/2013 | Cheng .................. G11C 11/413 365/154 |
| 8,743,645 B2 | 6/2014 | Nii et al. |
| 8,885,434 B2 * | 11/2014 | Kumar ....................... G11C 7/02 365/189.07 |
| 9,123,436 B2 * | 9/2015 | Chiou ........................ G06F 1/26 |
| 2011/0102072 A1 * | 5/2011 | Idgunji .............. H03K 19/0005 327/540 |
| 2014/0005967 A1 | 1/2014 | Fu et al. |

\* cited by examiner

*Primary Examiner* — Son Mai

(74) *Attorney, Agent, or Firm* — Procopio, Cory, Hargreaves & Savitch, LLP

(57) ABSTRACT

Systems and methods for optimizing a memory rail voltage are disclosed. The system may comprise a plurality of sensor cells, each sensor cell comprising at least one bitcell replica having a predefined data retention voltage higher than a data retention voltage of a similar memory bit cell. The sensor cells may be configured to provide an output based on a sensor rail voltage higher than the predefined data retention voltage. The system may further comprise a controller operably coupled to a power management circuit and configured to adjust the memory rail and the sensor rail voltages. The controller may be further configured to compare an expected value to the sensor indication. The controller may decrease the sensor rail voltage and the memory rail voltage based on the indication until a sensor indicates a bitcell replica has failed, indicating an optimum memory rail voltage has been reached.

30 Claims, 8 Drawing Sheets

SYSTEM AND METHOD FOR DYNAMICALLY ADJUSTING MEMORY RAIL VOLTAGE

BACKGROUND

1. Technological Field

The present invention relates to integrated circuits and, more particularly, to systems and methods for power reduction through dynamic adjustment of memory rail voltage.

2. Background

The increased use of mobile, battery-powered devices has increased the importance of reducing power consumption in large heterogeneous integrated circuits (ICs), such as system-on-a-chip (SoC) and the memory storage devices onboard the SoC, such as Static Random Access Memory (SRAM). Included among the techniques to achieve power reductions, is dynamically adjusting supply voltages based on tracking processes, temperature, and voltage drop.

However, in large ICs with many millions of transistors on a single die, there are several supply domains that can have independent voltage levels. Additionally, an IC can have a number of heterogeneous devices, for example, transistors with different threshold voltages (Vth) and channel lengths, with each type of device having its own performance and power attributes. Dynamically adjusting supply voltages for a whole IC can also be very difficult due to the use of (1) different technology library implementations such as high-speed and high-density; (2) different supply domains with different configurations of voltage regulators (e.g., using a switching mode power supply (SMPS) or low drop-out (LDO) regulator); and (3) a variety of hard macros that can each have a different supply domain and independent power controls.

SUMMARY

One aspect of the disclosure provides an apparatus for optimizing a memory rail voltage supplied to a plurality of memory bitcells, the memory bitcells configured to retain a memory value when a memory rail voltage is above a first data retention voltage. The apparatus may further comprise a plurality of sensor cells, each sensor cell comprising at least one bitcell replica having a predefined data retention voltage and configured to provide an output based on a sensor rail voltage, each sensor cell configured to provide a sensor indication comprising the output of the at least one bitcell replica. The apparatus may further comprise a power management circuit operably coupled to the plurality of sensor cells and configured to provide the memory rail voltage and the sensor rail voltage. The apparatus may further comprise a controller operably coupled to the power management circuit and to the plurality of sensor cells. The controller may be configured to compare an expected value to the sensor indication of one or more of the plurality of sensor cells. The controller may be further configured to decrease the sensor rail voltage and the memory rail voltage when the sensor indication matches the expected value.

Another aspect of the disclosure provides a method for optimizing a memory rail voltage supplied to a plurality of memory bitcells, the memory bitcells configured to retain a memory value when a memory rail voltage is above a first data retention voltage. The method may comprise providing a memory rail voltage to the plurality of memory bitcells and a sensor rail voltage to a sensor cell, the sensor cell comprising at least one bitcell replica having a predefined data retention voltage, the sensor cell being configured to provide a sensor indication, the sensor indication indicating an output of the at least one bitcell replica, the output based on the sensor rail voltage. The method may further comprise receiving a sensor indication from the sensor cell. The method may further comprise comparing an expected value to the sensor indication of one or more of the plurality of sensor cells. The method may further comprise decreasing the sensor rail voltage and the memory rail voltage when the sensor indication matches the expected value.

Another aspect of the disclosure provides an apparatus for optimizing a memory rail voltage supplied to a plurality of memory bitcells, the memory bitcells configured to retain a memory value when a memory rail voltage is above a first data retention voltage. The apparatus may comprise a plurality of means for sensing an ability of one or more memory bitcells to retain a memory value, each means for sensing configured to provide an indication based on a sensor rail voltage. The apparatus may further comprise a means for managing power operably coupled to the plurality of means for sensing and configured to provide the memory rail voltage and the sensor rail voltage. The apparatus may further comprise a means for controlling operably coupled to the means for managing power and to the plurality of means for sensing. The means for controlling may be configured to compare an expected value to the indication of one or more of the plurality of means for sensing, and decrease the sensor rail voltage and the memory rail voltage in voltage increments until one of the outputs of the plurality of sensing means does not match the expected value.

Another aspect of the disclosure provides an apparatus for optimizing a memory rail voltage. The apparatus may comprise a plurality of sensor cells, each sensor cell comprising at least one bitcell replica, each bitcell replica having a predefined data retention voltage higher than a data retention voltage of a similar memory bitcell, each sensor cell configured to provide a sensor indication based on a sensor rail voltage. The apparatus may further comprise a sensor power management circuit operably connected to each sensor cell and configured to supply the sensor rail voltage. The apparatus may further comprise a memory power management circuit operable connected to each memory bitcell and configured to supply the memory rail voltage. The apparatus may further comprise a controller operably connected to the sensor rail and memory rail power management circuits. The controller may be configured to compare each of the sensor indications to an expected value, decrease the memory rail voltage and sensor rail voltage in voltage increments until one sensor indication does not match the expected value, indicating that at least one bitcell replica has failed, bypass the failed sensor cells, monitor the bitcells that have not failed, and increase the memory rail voltage and sensor rail voltage by at least one increment if additional sensor cells fail.

Other features and advantages of the present invention should be apparent from the following description which illustrates, by way of example, aspects of the invention.

DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

SRAM may comprise millions of such transistors for creating memory cells, or "bitcells." Each bitcell may represent storage of a single bit (e.g., a 1 or 0) of data using the data retention characteristics of SRAM. However SRAM remains somewhat volatile in the sense that data may be lost if the memory does not remain powered. Accordingly, such memory cells may have varying power demands. For example, a given bitcell or plurality of bitcells comprising a memory, may each have a characteristic minimum data retention voltage (DRV). The DRV is the voltage level that the supply voltage (Vdd), or memory rail (hereinafter "Mx rail") voltage to that bitcell must remain above in order to ensure the memory value of a given bitcell remains intact. The DRV may depend on the construction of the bitcell and further vary according to ambient temperature and process variations, among other factors. As a non-limiting example, process variations as described herein, may include random dopant fluctuations, transistor length variation, die to die variations, and similar considerations. When the Mx rail voltage falls below the DRV, one or more bitcells of the memory will fail, potentially corrupting stored data.

Individual bitcells may vary significantly in DRV. Thus in order to maintain the integrity of bitcell memory values, the Mx rail voltage may remain above the highest individual bitcell DRV. This may lead to increased leakage power dissipation where the Mx rail voltage is set higher than the maximum DRV under certain operating conditions. Accordingly, in order to minimize power consumption and leakage power dissipation on the IC or by the SRAM, operation at a minimum voltage while remaining above the maximum DRV is desirable.

Figure 1:
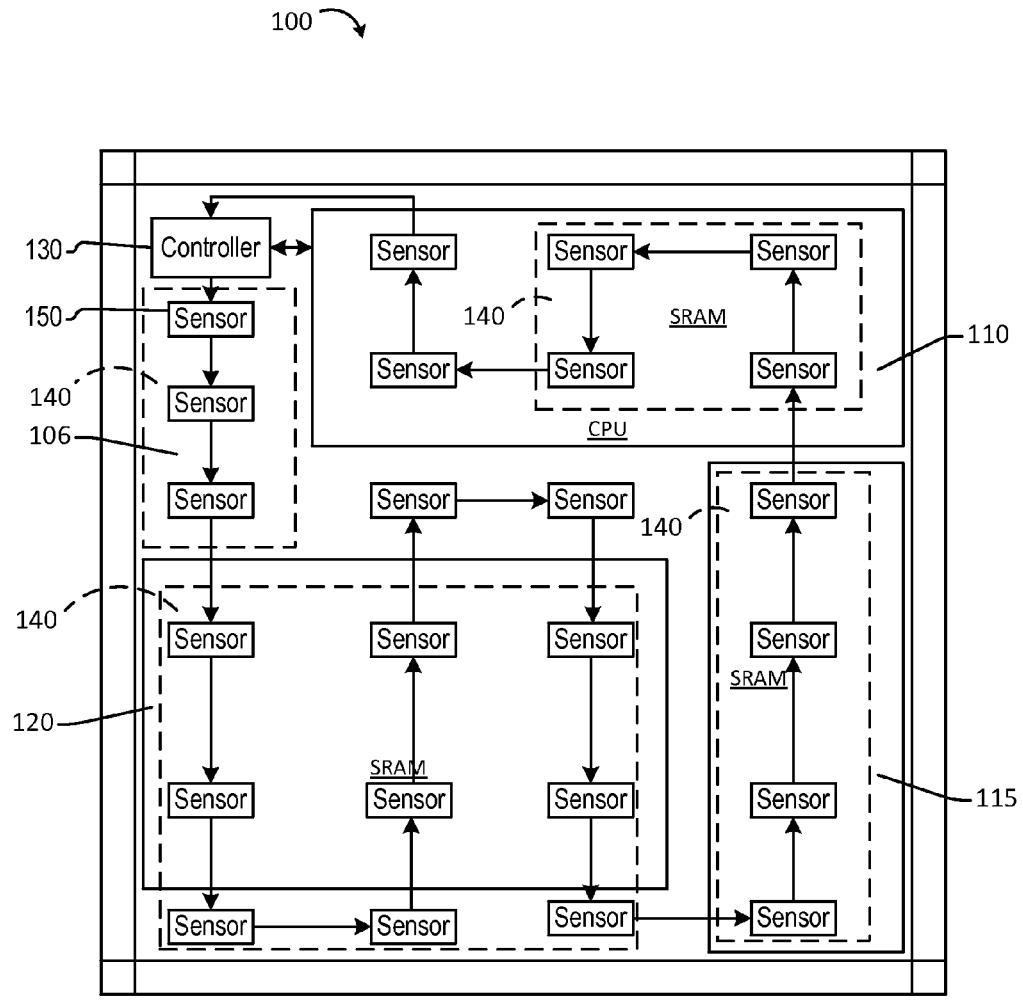
FIG. 1 is a functional block diagram of an integrated circuit comprising a plurality of sensor cells according to the disclosure.

FIG. 1 is a functional block diagram of an integrated circuit (IC) comprising multiple sensor cells according to the disclosure. As shown, an IC 100 comprises a processor (CPU) module 110, a graphics processing module (graphics module) 115, and a modem module 120 that are depicted as large blocks internal to the IC 100. Other necessary functions of the IC 100 may be spread throughout remaining "core" areas 106 of the IC 100 as required by various embodiments. Each of the CPU 110, the graphics module 115, the modem module 120, the core areas 106, among other components, may comprise SRAM 140 or other types of memory. The SRAM 140 is shown with dotted lines indicating that the SRAM 140 may be located throughout the IC 100, and within multiple different components.

The IC 100 may also comprise one or more controller modules (controller) 130. The controller module may be operably connected to a plurality of sensor cells 150 distributed around various locations of the IC 100. Only one sensor cell 150 is labeled in FIG. 1 to improve readability of the figure. The sensor cells 150 may be located within and without the SRAM 140 throughout the IC 100. Although FIG. 1 illustrates twenty-four sensor cells 150, in an embodiment, the IC 100 may include many hundreds or thousands of sensor cells 150. The sensor cells 150 may be operably connected in series (as shown) or in parallel (described below in connection with FIG. 7, FIG. 8, and FIG. 9) and controlled by the one or more controllers 130.

In an embodiment, the sensor cells 150 may be connected in a zigzag pattern, as shown or in other patterns as required by a given embodiment. Additionally, the sensor cells 150 for a given SRAM module 140 may be contiguous (or mostly contiguous) so the SRAM module 140 can be powered down and those sensor cells 150 bypassed as a block. For example, the sensor cells 150 in the CPU 110 may be bypassed by coupling the output of chain of sensor cells 150 in graphics module 115 directly to the controller 130. Circuitry in the sensor cells 150, or other circuitry, may perform the bypass of a block. Individual sensor cells 150 may also be bypassed.

In at least one embodiment, the sensor cells 150 may have an independent power supply that continues to provide power when the SRAM modules 140 are powered down (see FIG. 7, FIG. 9, below).

The sensor cells 150 may be distributed on the IC 100 in a manner providing sensor cell 150 capabilities to all memories (SRAM and non-SRAM) within certain areas of the IC 100. Sensor cells 150 may be disposed close to or within memories (e.g., the SRAM 140), in areas known to have thermal "hot spots," or wherever required by a given IC 100 design. In an embodiment, not all SRAM 140 modules have the same number or concentration of sensor cells 150. Accordingly, the sensor cells 150 may be distributed based on location within the IC 100, functional capability or other desired aspects.

Figure 2:
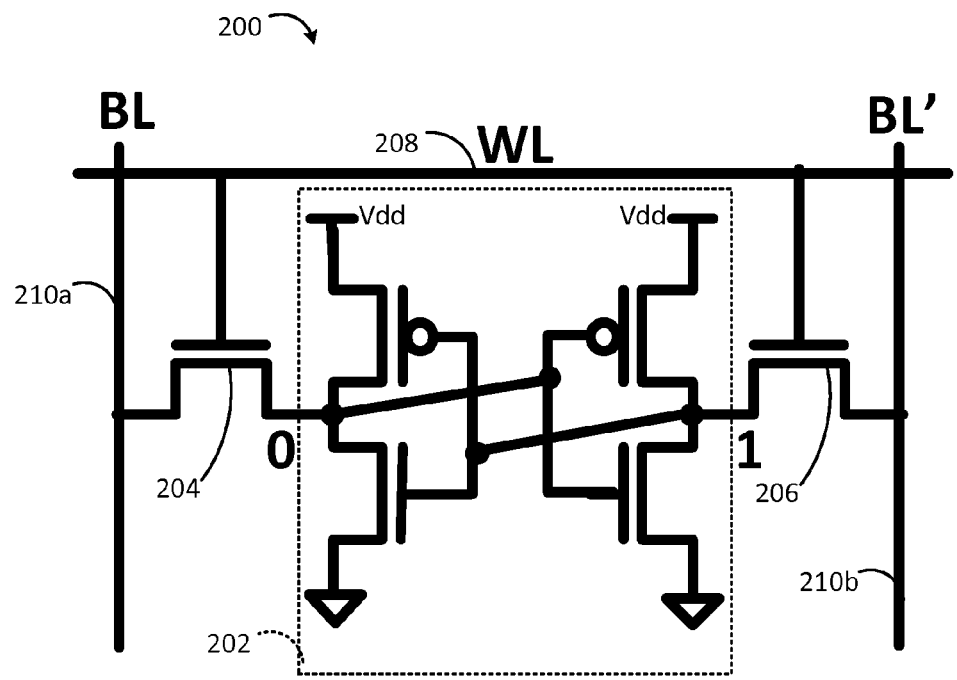
FIG. 2 is a circuit diagram depicting an exemplary memory bitcell according to the disclosure.

FIG. 2 is a circuit diagram depicting an exemplary memory bitcell according to an embodiment. The SRAM 140 may comprise many thousands or millions of memory bitcells 200 in order to store or retain memory in the SRAM modules 140. Each memory bitcell 200 comprises a bistable latching circuit, comprising a plurality of transistors (e.g., transistors, Metal Oxide Field Effect Transistor (MOSFET)), configured to retain a binary memory value (1 or 0). In an embodiment, the memory bitcell 200 comprises back-to-back inverters 202 with two access transistors 204, 206. When the cell is not in use (e.g., a read/write operation), the two access transistors 204, 206 are closed and the data value is kept in a stable state, latched within the back-to-back inverters 202. An exemplary 6T (transistor) bitcell is shown, however any bitcell may be implemented as needed.

The SRAM 140 and each of its constituent memory bitcells 200 are electrically powered to retain the binary memory value. The memory bitcells 200 are provided a supply voltage (Vdd) via a power rail or bus, described below. Without sufficient supply voltage (Vdd), the memory bitcell 200 is volatile and may lose the stored memory value. The minimum supply voltage (Vdd) required by the memory bitcell 200 to retain a memory value may be generally referred to herein as Vmxret, as in "memory retention voltage." For example, the memory bitcells 200 may retain their memory value so long as Vdd remains at or above Vmxret.

Each memory bitcell 200 may have a characteristic DRV. The DRV describes a minimum voltage (Vdd) required by individual memory bitcells 200 to retain memory values. In some embodiments, the DRV may be equal to the Vmxret. The DRV of the various memory bitcells 200 within the SRAM 140 may characteristically vary from one memory bitcell 200 to another, thus the DRV of the SRAM 140 may not be constant across all of the memory bitcells 200 in the SRAM 140 memory. DRV and data retention sensitivity may further vary with or be based on temperature or process variations. Therefore, some memory bitcells 200 may fail at different temperatures, different times, during various processes, and at different Vdd levels. In order to ensure the integrity of all of the memory stored within the SRAM 140, the Vdd voltage should notionally remain above the highest DRV of a memory bitcell 200 within the SRAM 140.

Vdd is continuously provided to each of the SRAM 140 modules within the IC 100 whether or not a read/write operation is occurring within the SRAM 140. Thus the SRAM 140 remains constantly powered even in the data retention state. As the percentage of IC 100 area dedicated to memory increases, on-chip SRAM (e.g., the SRAM 140) may contain as much as 50-90 percent of total transistor count in the IC 100. Accordingly, the transistors are major source of leakage power dissipation. Thus the constant power requirements of the SRAM 140 tend to increase leakage power dissipation and the overall power consumption of the IC 100. In order to minimize leakage power dissipation of the IC 100, the Vdd should be kept to a minimum. However, because DRV may vary across the SRAM 140, simply lowering the Vdd supply voltage until memories fail provides an imperfect solution that may result in the loss or corruption of stored data. Accordingly, the sensor cells 150 may provide an indication of a minimum Vdd supply without sacrificing critical memory.

In some embodiments, the memory bitcell 200 may further include a word line (WL) 208. The WL 208 may provide access to the cell, controlling the two access transistors 204, 206 which, in turn, control whether the memory bitcell 200 should be connected to one or more bitlines (BL), BL 210a and BL' 210b (collectively BLs 210). The BLs 210 are used to transfer data to and from the back-to-back inverters 202 for both read and write operations.

Figure 3:
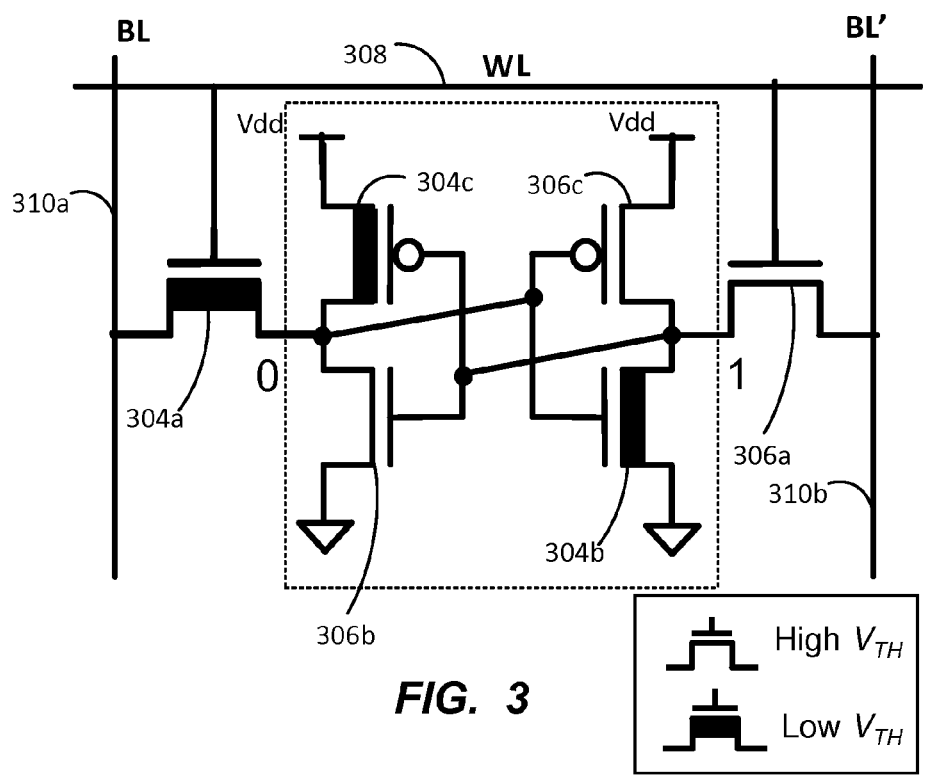
FIG. 3 depicts a circuit diagram of a bit cell replica according to the disclosure.

FIG. 3 depicts a circuit diagram of a bit cell replica according to the disclosure. A bitcell replica 300 is depicted having a structure similar to the memory bitcell 200. Each sensor cell 150 may comprise a one or more bitcell replicas 300. The bitcell replica 300 is configured to store a binary value in a similar manner to the memory bitcell 200, incorporating transistors and other components with different electrical characteristics. For example, the bitcell replica 300 may comprise transistors (e.g., MOSFETs) having different threshold voltages, as shown in the key of FIG. 3.

As shown, the bitcell replica 300 may include two access transistors 304a, 306a, similar to the two access transistors 204, 206 (FIG. 2). The two access transistors 304a, 306a may provide access to a WL 308 and further allow read/write operations to occur via BL 310a and BL' 310b, similar to the WL 208 and BLs 310 of FIG. 2.

The bitcell replica 300 may further comprise a flip-flop circuit 302, comprising two transistors 304b, 304c having a low threshold voltage (low Vth) and two transistors 306b, 306c having a high threshold voltage (high Vth). In certain embodiments, this provides the bitcell replica 300 with a characteristic DRV that is higher than that of the memory bitcell 200 and may be selected predicated on design requirements. Similar to above, an exemplary 6T bitcell is depicted; however any bitcell design may be employed such that the bitcell replica 300 should adequately replicate the characteristics of the memory bitcell 200 as described herein In an embodiment, the leakage sub-threshold currents of the memory bitcells 200 may be higher at increased temperatures leading to increased power dissipation and decreased efficiency. Thus, by selecting transistors (e.g., the transistors 306) having high dissipation currents when storing a "0" state, for example, such a bitcell replica 300 may be more prone to failure than a corresponding memory bitcell 200 at the same voltage (Vdd) level. Thus the bitcell replica 300 with fail when the supply voltage (Vdd) is further reduced below its DRV, when the memory bitcell 200 will not.

Accordingly, the bitcell replica 300 may fail to retain a memory value at a Vdd that is notionally higher than the DRV of the memory bitcell 200. Thus, the sensor cells 150 comprising a plurality of bitcell replicas 300 may provide an indication to the controller 130 that the Vdd is at a level that is approaching minimum Vmxret or the DRV of the memory bitcells 200.

In an embodiment, the DRV of the bitcell replicas 300 may be selected to enable accurate adjustment of the Vdd supply to the SRAM 140, minimizing leakage power dissipation while maintaining a Vdd above the DRV of the memory bitcells 200. In certain embodiments the Vdd adjustment may be conducted on a per-die basis. In still other embodiments, the dynamic rail voltage adjustment may further eliminate the experimentation required to conduct manual DRV selection and the extensive analysis required to create databases allowing selection of Vdd levels for various process and temperature criteria.

Figure 4:
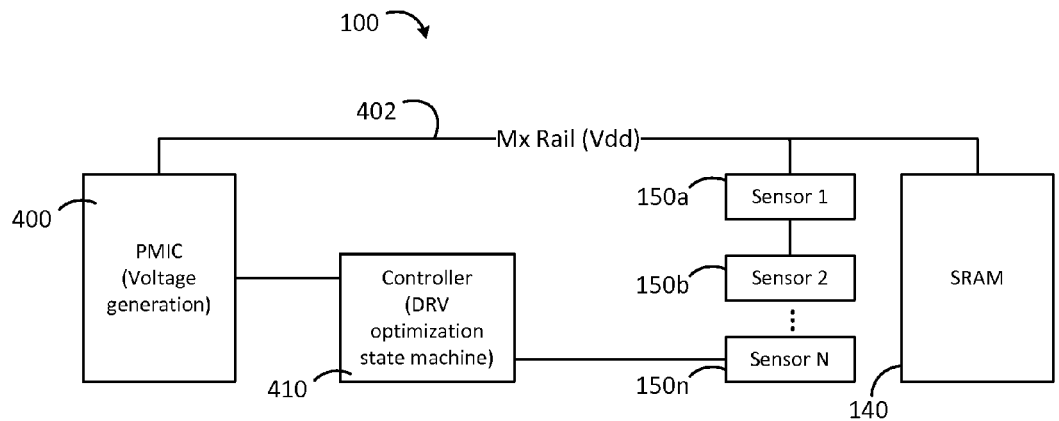
FIG. 4 is a functional block diagram of an integrated circuit comprising multiple sensor cells according to the disclosure.

FIG. 4 is a functional block diagram of an integrated circuit comprising multiple sensor cells according to the disclosure. As shown, an IC 400 depicts another embodiment of an integrated circuit, similar to the IC 100, according to an embodiment. The IC 400 comprises multiple sensor cells 150, similar to the IC 100. In an embodiment, the IC 400 may further comprise a power management integrated circuit (PMIC) 400. The PMIC 400 may provide power and power control for the various functions of the IC 400, including the Vdd supply for the memory rail (Mx rail) 402. The Vdd may also be referred to herein as "Mx rail voltage." The Mx rail voltage may comprise a "global" power supply, meaning the Mx rail may provide power to all of the sensor cells 150 within the IC 400. The PMIC 400 may provide power (voltage) via the Mx rail 402 to at least the SRAM 140 and sensor cells 150a-150n. The sensor cells 150a-150n may be collectively referred to herein as the sensor cells 150, similar to above.

The IC 400 may further comprise a controller 410 operably connected to the PMIC 400 and configured to adjust the Mx rail 402 voltage provided to the sensor cells 150 and to the SRAM 140. The controller 410 may be similar to the controller 130 (FIG. 1). The controller 410 may be further configured to receive input from the sensor cells 150 and to provide control signals or command power adjustment of the PMIC 400 for the various functions of the IC 400.

In an embodiment, the PMIC 400 may be an "on-die" or "off-die" power source. FIG. 4 depicts that the PMIC 400 as an on-die power source however in certain IC designs, the power provided by the PMIC 400 may be provided by an external power source.

Figure 5:
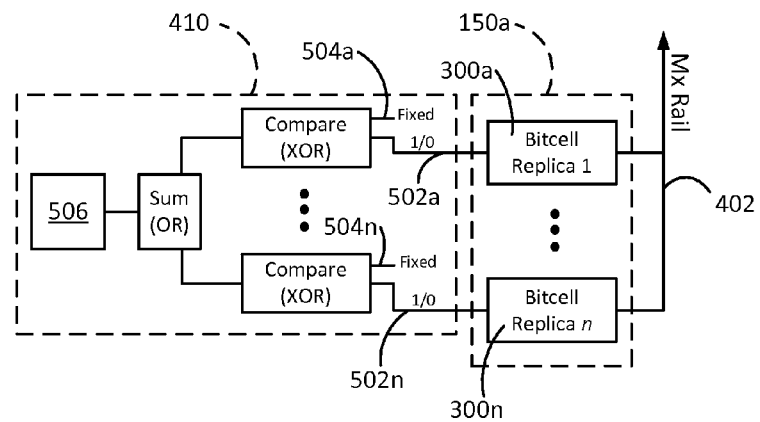
FIG. 5 is a functional block diagram of an exemplary sensor cell according to the disclosure.

FIG. 5 is a functional block diagram of an exemplary sensor cell (e.g., the sensor cell 150), according to the disclosure. As shown, the sensor cell 150 may comprise a plurality of bitcell replicas 300a-300n each having different characteristics (e.g., different DRVs). The bitcell replicas 300a-300n shown in FIG. 5 are similar to those described in connection with FIG. 3 and may be collectively referred to herein as "bitcell replicas 300." As described above, the bitcell replicas 300 may be structurally similar to the memory bitcell 200 within the SRAM 140 and similarly configured to retain a bit value. The bitcell replicas 300 may be further configured to have slightly higher DRV than that of the memory bitcell 200 under certain environmental or process conditions. The bitcell replicas 300 are configured to provide an output 502. The output 502 comprises a binary value corresponding to the stored memory value of the memory bitcell 200. The output 502 may then be compared to an expected value 504a that is fixed within the logic of the controller 410. The expected value 504a may be indicative of a value of a bitcell replica 300 with a successfully retained memory value.

For example, when the PMIC 400 supplies a Vdd via the Mx rail 402 that is above the DRV of the bitcell replica 300a, the expected value 504a and the output 502a should match, because the bitcell replica 300a has sufficient power to retain memory (e.g., the memory value). That is, the matching values (the output 502a and the expected value 504a) may indicate the bitcell replica 300a is functioning properly and able to retain memory. Such a match may allow the controller 410 to reduce the Vdd on the Mx rail 402, decreasing the leakage power dissipation of the IC 100. Due to the design characteristics of the bitcell replicas 300, even the reduced Mx rail 402 voltage may remain above the DRV of the memory bitcell 200. Accordingly, the power (Vdd supply) may be reduced while maintaining the integrity of the SRAM 140.

In another embodiment, as the Vdd on the Mx rail 402 is reduced, if the bitcell replica 300n output 502n does not match the expected value 504n, this may indicate that the DRV for the bitcell replica 300n has been reached and further reduction may be detrimental to the SRAM 140. Each of the bitcell replicas 300 may be designed such that they will fail due to low power before the actual SRAM memory bitcells 200.

In an embodiment, the comparisons may be summed to provide a sensor indication 506. The summation may be serial as shown by the daisy-chained sensor cells 150 in FIG. 1. The outputs 502 of the bitcell replicas 300, the comparisons, and summation resulting in the sensor indication 506 may be further provided to the controller 410 in parallel or via a bus interface. In an embodiment, the sensor indication 506 may be derived within the controller 410, as shown in dashed lines. In another embodiment, the sensor indications 506 may also be provided to the controller 410 by the sensor cells 150.

As described herein, the sensor cells 150 may implemented for sensing a minimum Mx rail 402 voltage (Vdd) while still maintaining successful memory retention within the SRAM 140. However, the sensor cells 150 may also be implemented during an active state (e.g., during read/write operations) within the SRAM modules 140 and be combined with certain core power reduction (CPR) systems and methods. The sensors cells 150 provide a capability of reducing leakage power dissipation while maintaining the integrity of onboard memories.

Figure 6:
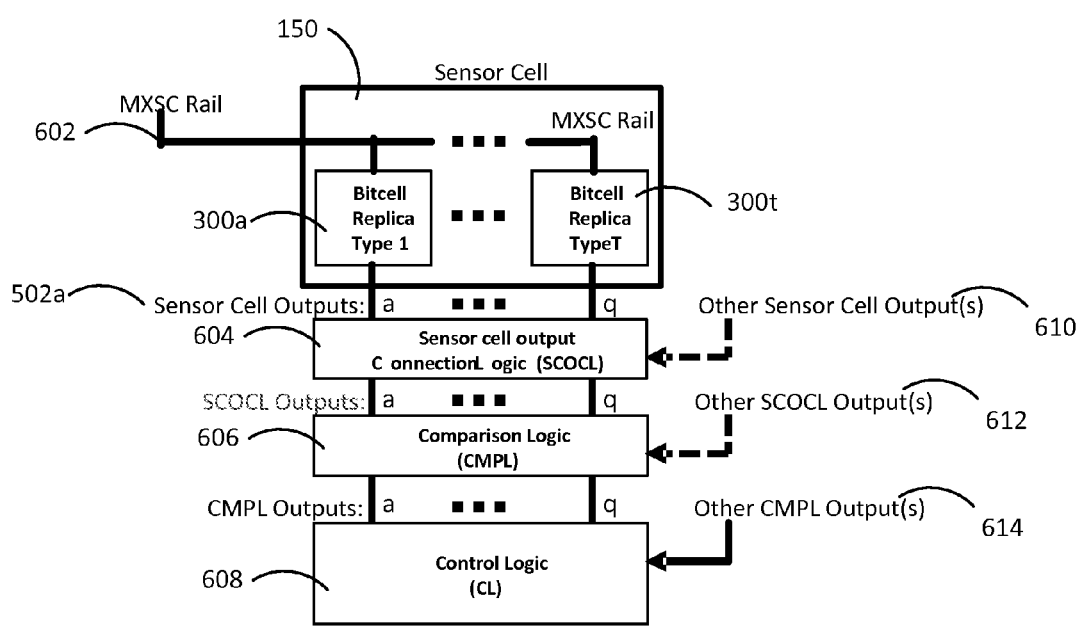
FIG. 6 is a functional block diagram of another embodiment of the sensor cell of FIG. 5, according to the disclosure'

FIG. 6 is a functional block diagram of another embodiment of the sensor cell of FIG. 5, according to the disclosure.

In the embodiment shown, the sensor cell 150 comprises multiple bitcell replicas 300 (300a-300t) as before, operably connected in parallel with other bitcell replicas 300. In the embodiment shown, the sensor cell 150 is powered by a sensor cell (MxSC) rail 602. The MxSC rail 602 may be distinct from the Mx rail 402, and separately powered by the PMIC 400 (FIG. 4) or other power supply.

As shown in FIG. 6, each of the bitcell replicas 300 may provide the output 502 to sensor cell output connection logic (SCOCL) 604. The sensor cell 150 outputs 502 may be encoded and/or combined in the SCOCL 604 (e.g. through a serial or bus interface). In an embodiment, the SCOCL 604 may be optional, thus the output 604 may be passed directly to comparison logic 606. As previously noted, the output 502 (e.g., the output 502a-502q) may be combined and compared in parallel or serially to fixed, or expected values (e.g., the expected value 504a-504n of FIG. 5) within the comparison logic 606. The results of the comparison, indicating the same or differing output from the expected value 504, may be provided to certain control logic 608. The control logic 608 may be logic resident in the controller 410 (FIG. 2) or the controller 130 (FIG. 1) for determining appropriate adjustments to the MxSC rail 602 voltage. In an embodiment, the SCOCL 604, the comparison logic 606, and the control logic 608 may programmed or reside within the controller 410 (FIG. 4) or the controller 130 (FIG. 1).

Multiple sensor cells 150 may be concatenated within the SRAM 140. Accordingly, the SCOCL 604 may be further configured to accept input from other sensor cell 150 outputs 610. Likewise, the comparison logic 606 may be configured to accept SCOCL outputs 612 from other sensor cells 150 and the control logic 608 may be configured to accept input from other comparison outputs 614 from other sensor cells 150. The SCOCL 606, the comparison logic 606 and the control logic 608 may be substantially similar to the sensor indication 506 of FIG. 5.

Figure 7:
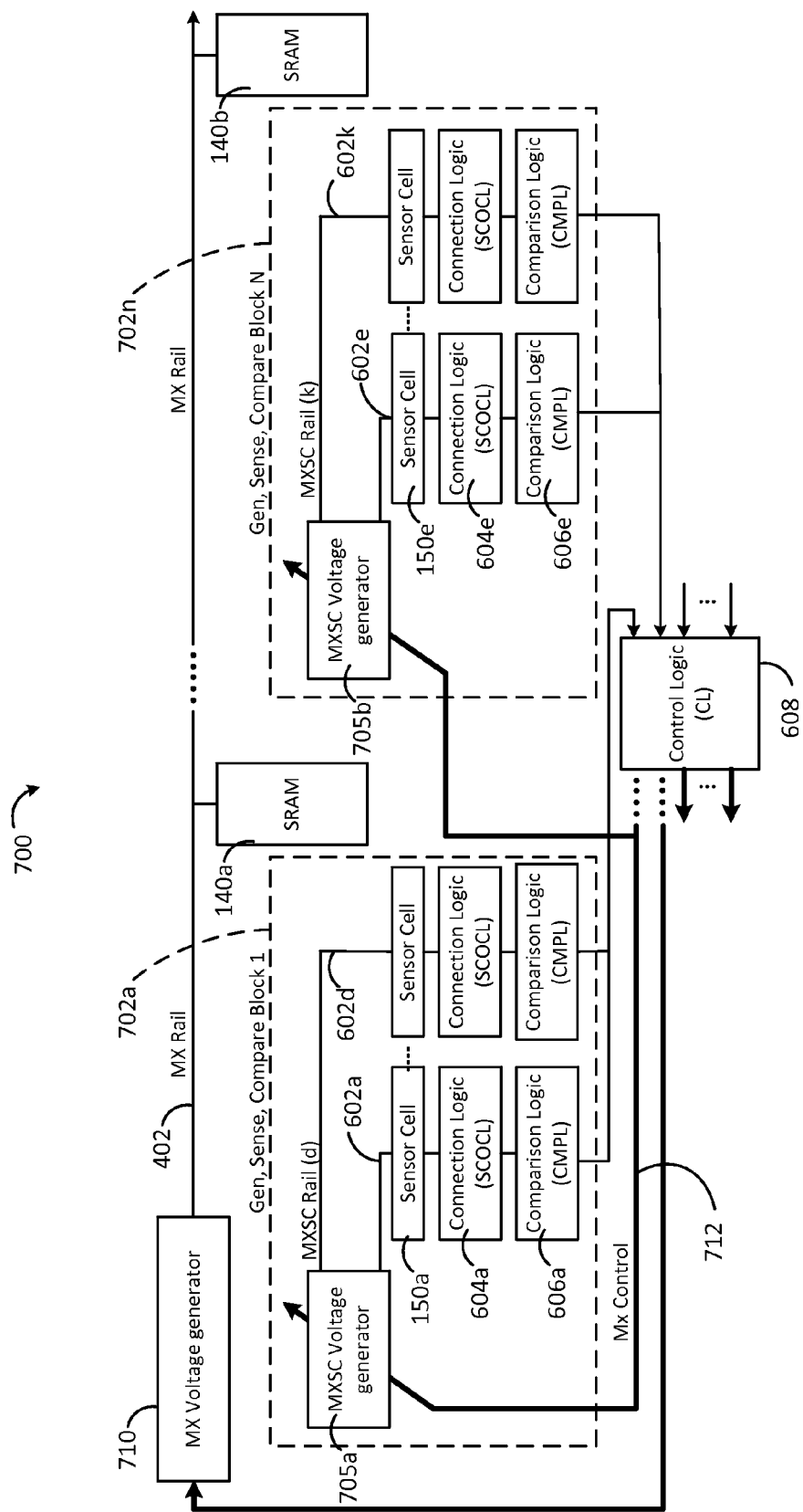
FIG. 7 is a functional block diagram of another embodiment of an integrated circuit, according to the disclosure.

FIG. 7 is a functional block diagram of another embodiment of an integrated circuit, according to the disclosure. As shown, an IC 700 comprises an Mx voltage generator 710. The Mx voltage generator 710 is configured to supply voltage (Vdd) to the Mx rail 402 and in turn to multiple SRAM modules 140a-140b, as disclosed herein. The Mx voltage generator 710 may perform functions similar to the PMIC 400 of FIG. 4.

The IC 700 further comprises a plurality of generate-sense-compare (GSC) blocks 702a-702n, collectively referred to herein as GSC blocks 702. As shown, two GSC blocks 702 are shown separated by a dotted line in the Mx rail 402 indicating that any number of the GSC blocks 700 may be concatenated to combine the sensor cell 150 indications. The GSC block 702a comprises an MxSC voltage generator 705a. The MxSC voltage generator 705a is configured to provide MxSC voltage (Vdd) to the MxSC voltage rails 602a-602d, as shown in FIG. 6. The MxSC rails 602a-602d are analogous to the MxSC rail 602 of FIG. 6 and separate from the Mx rail 402, further decoupling the voltage supply selection process from the memory state of the SRAM modules 140. For example, the selection of the voltage applied to the Mx rail 402 may be executed independently of a memory retention state or an active (read/write) memory state of the IC 700. Similar to above, the GSC block 702a may combine multiple instances of the sensor cells 150 and logic described in FIG. 6, each with its own connection to the MxSC rails 602a-602d.

The comparison logic 606a-606d may comprise the sensor indications 506 (not shown in this figure) to the control logic 608. In some embodiments, the control logic 608 may be contained in the controller 130 or in the controller 410. The "pass" or "fail" output of each sensor cell 150 (e.g., the sensor indication 506) may be compared with the next neighboring sensor cell 150d output and propagated in a daisy chain fashion until the control logic 608 within the controller 410. The control logic 608 may receive all of the comparison data from all of the connected sensor cells 150 that to determine a desired adjustment to the Mx rail 402 voltage, or Vdd supply. The controller 410 may then command the MxSC voltage generator 705a via an Mx control connection 712. The Mx control connection 712 may convey commands from the control logic 608 (e.g., the controller 410) to all of the voltage generators 705 to adjust their respective MxSC rails 602 to a specific voltage, according to the comparison. Furthermore, the controller 410 may provide commands to the Mx voltage generator 710 to reduce the Mx rail voltage Vdd to a lower voltage (e.g., MxRET voltage), thereby decreasing leakage power dissipation during memory retention. In certain embodiments, the Mx rail voltage and the MxSC rail voltages will be equal.

In an embodiment, the plurality of MxSC rails 602a-602k may be compared in parallel to increase the rate of voltage adjustment of the Mx rail 402, however this may be done at the expense of increased area dedicated to the sensor cells 150 and associated logic. This may further decrease the amount of physical area on the IC 700 available for SRAM modules 140 or other required functions. The sensor cells 150 of the IC 700 may be used to evaluate multiple, or "k" number of voltages concurrently, as shown.

The IC 700 depicts independent MxSC voltage generators 705, SCOCL 604, and comparison logic 606, however in an embodiment, such logic blocks may be shared or time multiplexed as required. Accordingly, the multiple blocks shown a representative of the logic associated with each of the sensor cells 150 or the controller 410.

Figure 8:
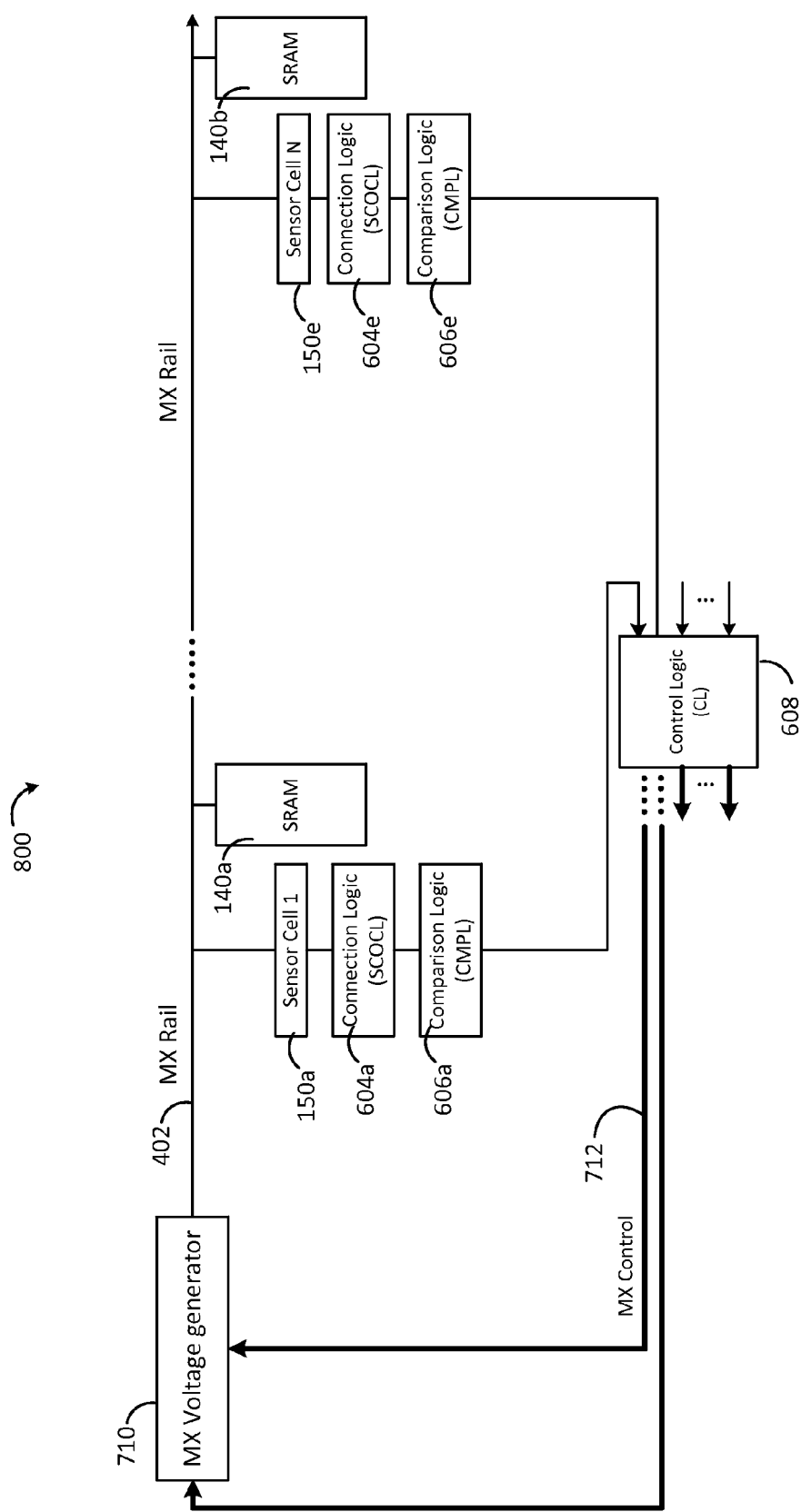
FIG. 8 is a functional block diagram of another embodiment of an integrated circuit, according to the disclosure.

FIG. 8 depicts a functional block diagram of an IC 800. As shown, the IC 800 provides an Mx voltage generator 710 as before, providing the Mx rail 402 voltage to a plurality of SRAM modules 140a-140b. The IC 800 comprises sensor cells 150a-150e and associated connection logic 604a-604e and comparison logic 606a-606a. The comparison logic 606a-606e as previously described, may be operably connected to the control logic 608 within the controller 410. The control logic 608 within the controller 410 (not shown in this figure) is then operably connected to the Mx voltage generator 710. Accordingly, the controller 410 may command the Mx voltage generator 710 to decrease or increase the Mx rail voltage according to the comparisons and sensor indications 506 (FIG. 5) received from the sensor cells 150, thereby reducing leakage power dissipation.

In an embodiment, the sensor cells 150 of the IC 800 may be implemented to evaluate Mx rail voltages consecutively, without summing multiple sensor cell 150 outputs. The controller 410 may then receive individual sensor indications 506 from each sensor cell 150.

Figure 9:
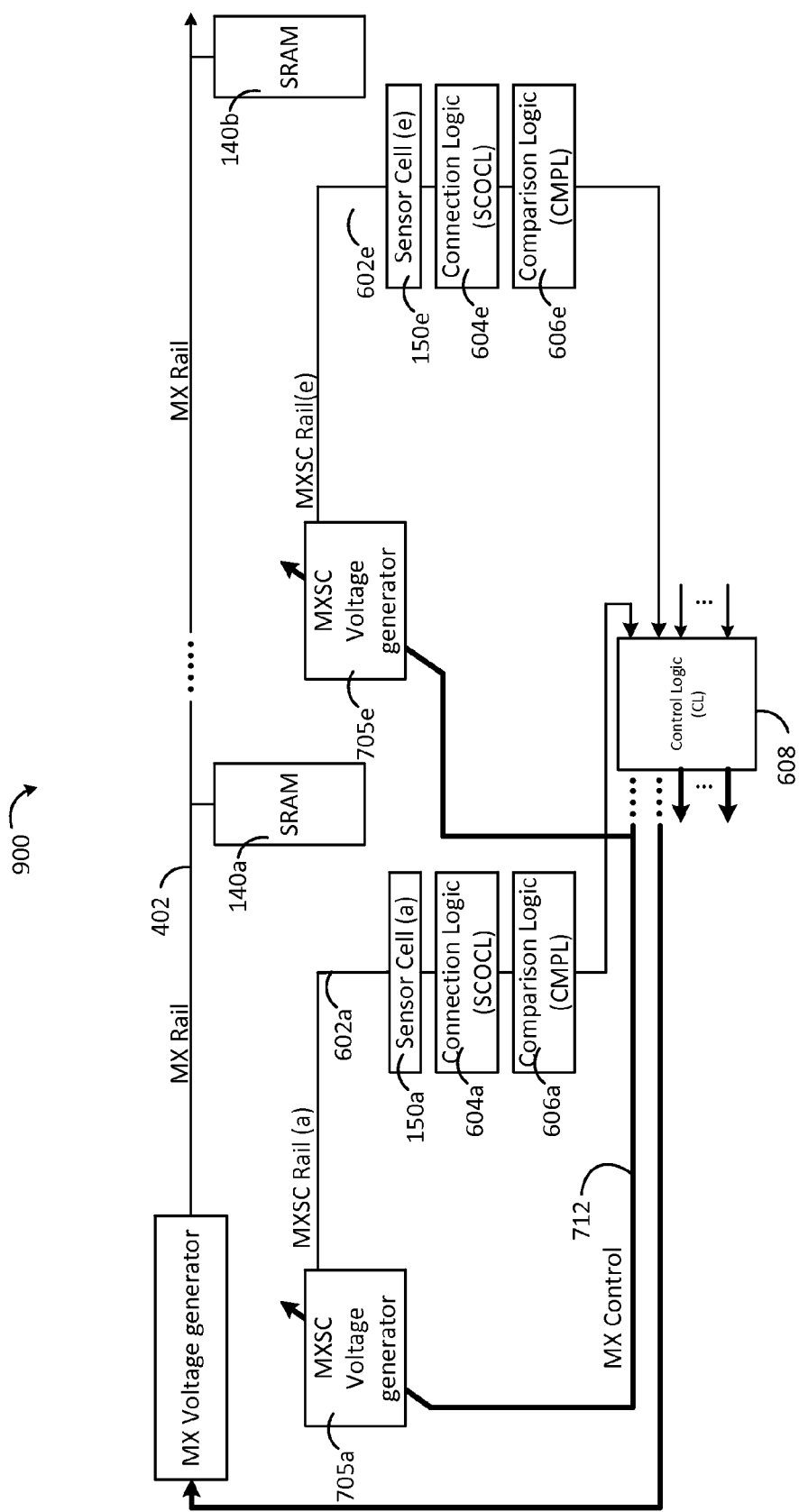
FIG. 9 is a functional block diagram of another embodiment of an integrated circuit, according to the disclosure.

FIG. 9 depicts an IC 900. As shown, the IC 900 comprises an Mx voltage generator 710 as previously described, providing the Mx rail voltage to a plurality of SRAM modules 140a-140b. In an embodiment, the IC 900 may comprise an individual MxSC voltage generator 705a-705e for each of the sensor cells 150a. The MxSC voltage generation 705a-705e may be similar to that shown in FIG. 7.

The IC 900 may the take advantage of a large number of sensor indications 506, wherein each of the sensor cells 150 receives an independent MxSC rail voltage 705a-705e. Such a power distribution architecture may allow greater flexibility in adjusting MxSC rail voltages without adjusting the Vdd supply to the Mx rail 402. This may further provide additional information to the controller 410 regarding SRAM module 140 and sensor cell 150 DRV distribution over the surface area of the IC 900.

In an embodiment, the sensor cells 150 of the IC 900 may be used to evaluate MxSC voltages consecutively using a MxSC voltage generator. The remaining aspects of the IC 900 are similar to the IC 700 and the IC 800 described above.

Figure 10:
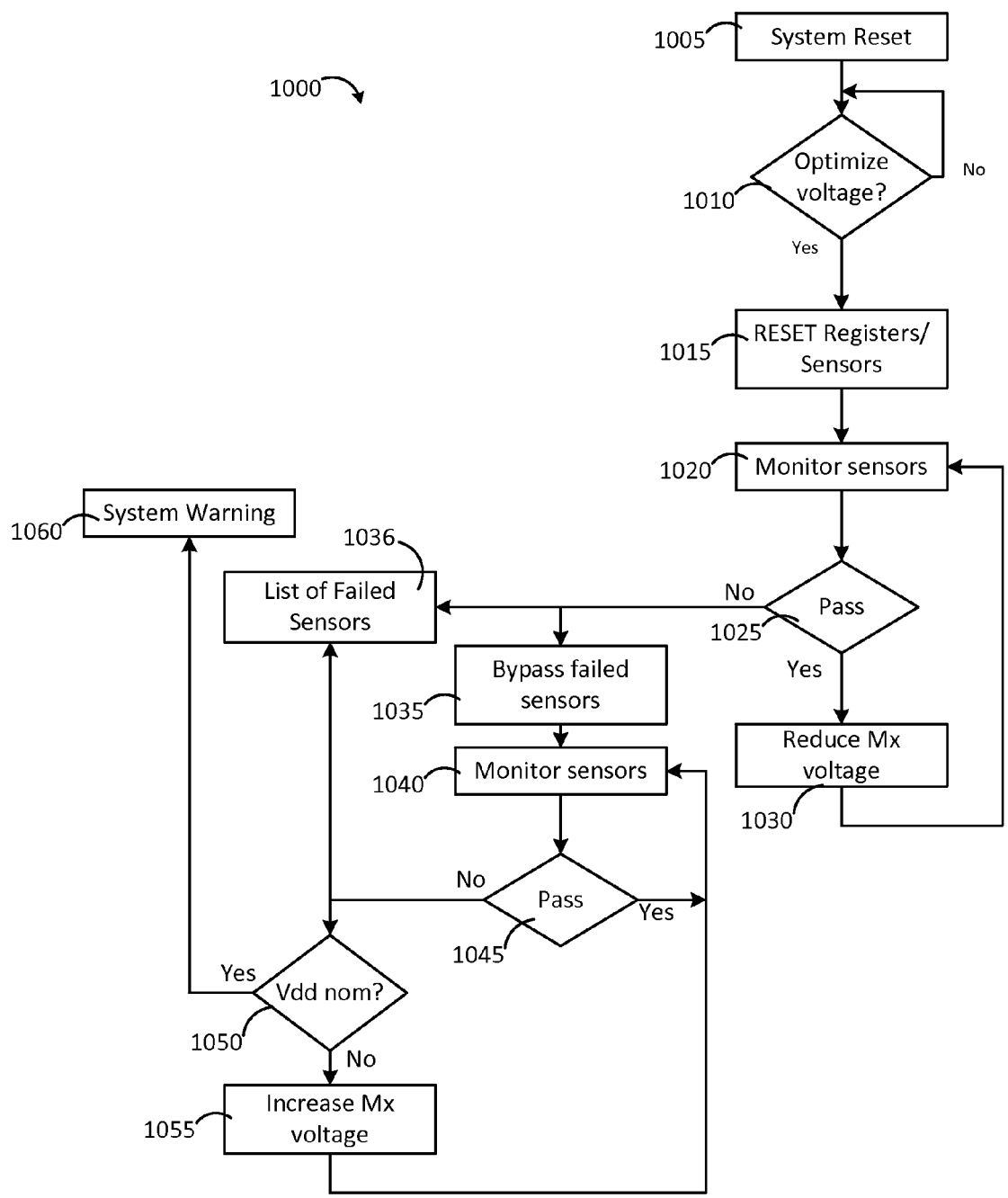
FIG. 10 is a flowchart depicting a method of dynamically adjusting the memory rail voltage to minimize leakage power dissipation, according to the disclosure.

FIG. 10 is a flowchart depicting a method of dynamically adjusting the memory rail voltage to minimize leakage power dissipation, according to the disclosure. As shown, a method 1000 can be carried out or implemented by the controller 410 (e.g., the controller/state machine 410 of FIG. 4) and within the various integrated circuits described herein. The method 1000 may further be indicative of the processes completed cooperatively by the CPU 110 and the controller 130 (FIG. 1) or the control logic 608 of the IC 100, 400, 700, 800, 900. The method 1000 may further be implemented to optimize the Vdd supply voltage of the Mx rail 402 and while minimizing leakage power dissipation of the SRAM modules 140.

The method 1000 may begin at block 1005 with a system reset. On a system reset (e.g., a system boot), the controller 410 may employ the control logic 608 to evaluate the sensor cell 150 input. At decision block 1010 if the controller 410 is not required to optimize the voltage supplied to the Mx rail 402 due to a read/write operation on the SRAM module 140, the method 1000 may delay until such a voltage optimization is needed.

The controller 410 may command a voltage optimization at decision block 1010 during a memory retention state outside of normal read/write operations to the SRAM module 140. The voltage optimization of the method 1000 is useful during the data retention period when the SRAM modules 140 require constant power (e.g., Vdd) to retain bit values within the memory bitcells 200. Optimizing the voltage via the method 1000 may minimize leakage power during the data retention periods.

If the voltage optimization is needed due to a memory retention state, then the method 1000 progresses to block 1015. At block 1015, the memory registers (e.g., the SRAM modules 140) and the sensor cells 150 may be reset to provide a baseline voltage and/or comparison reading to the controller 410.

At block 1020, the controller 410 may monitor the sensor cells 150 for the sensor indications 506 or comparison information. If at decision block 1025 the sensor indications 506 (e.g., the comparison logic 606 or the control logic 608) indicate that the bitcell replicas 300 within the sensor cells 150 are able to retain memory values at the presently set voltage Vdd (e.g., the Mx rail 402 voltage or the MxSC rail voltage 602) then at block 1030 the controller 410 may command a reduction in the Mx rail 402 voltage (Vdd). Reduction of the Vdd supply voltage may be completed in predetermined increments or discrete steps. For example, a reduction in voltage may comprise an incremental 0.1 millivolt (mV) step up or down in Vdd.

The method 1000 may then return to block 1020 and continue monitoring the sensor indications 506 (e.g., the output 504, the summation of sensor indications 506 (FIG. 5)). In certain embodiments, the method 1000 may be implemented in system architectures similar to the IC 700, the IC 800, and the IC 900, adjusting the MxSC voltage, the Mx rail voltage, or both as needed as the controller 410 maintains an optimal Vdd, that is, a Vdd as low as possible while remaining above the DRV of the SRAM modules 140.

If at decision block 1025 the comparison logic 606 indicates that one or more of the bitcell replicas 300 within the sensor cells 150 has failed to retain the memory value, that is, the comparison with the expected value 504 (FIG. 5) has failed, then the controller may not further reduce the Vdd supply voltage to the Mx rail 402 because the optimum Mx rail 402 voltage (Vdd) has been reached.

In certain embodiments, the first bitcell replica 300 in the sensor cell 150 that fails will indicate to the controller 410 that the optimum Mx rail 402 voltage (Vdd) has been reached. This is because the first bitcell replica 300 will fail at a voltage above the highest DRV in the SRAM 140 due to the design of the bitcell replicas 300 and voltage requirements of the SRAM module 140.

From decision block 1025, the method 1000 may proceed to block 1036, adding an identification of the failed sensor cell(s) 150 to a list of failed sensor cells 150 maintained by the controller 410. The method 1000 may simultaneously proceed to block 1035 where the controller 410 may bypass the certain sensor cell(s) 150 that failed the comparison at the current Mx rail/MxSC rail voltage Vdd. The controller may temporarily or selectively remove them from consideration as sensors because they have already failed. Accordingly, the controller 410 may ignore the output of, or remove power from, the failed sensor cell(s) 150. This may be useful to the controller 410 in determining whether the optimum voltage is maintained or whether further adjustment is required.

At block 1040, the controller 410 may also continue to monitor the other sensor cells 150 that have not failed due to low Vdd. If the sensor cells 150 pass the comparison at decision block 1045, the controller 410 may continuously monitor the remaining sensor cells 150 that have not failed. Accordingly, the loop at decision block 1045 may be referred to a "continuous monitor" loop.

If at the decision block 1045 the controller 410 receives an indication that further sensor cell(s) 150 have failed, the controller 410 will again add the failed cells to the list of failed sensors at block 1035. The controller 410 may also simultaneously determine if the Mx rail 402 is already powered at the nominal supply voltage ($Vdd_{nom}$). $Vdd_{nom}$ may generally refer to the Vdd supply voltage of the Mx rail 402 that has not been reduced, for example, a starting voltage following system reset or a maximum common operating voltage.

If the IC 100 is operating below the $Vdd_{nom}$ at decision block 1050, then the method 1000 may proceed to block 1055, increasing the Mx rail 402 voltage (Vdd). In some embodiments, the increase in Vdd may prevent further sensor cells 150 from failing, preserving the integrity of the SRAM modules 140. The method 1000 may then proceed back to block 1040 to continuously monitor the sensor cells 150.

If the IC 100 is already operating at the $Vdd_{nom}$ at decision block 1050, then the controller 410 may flag the operation and transmit a system warning at block 1060. The system warning may be transmitted to a higher protocol within the system indicating that the voltage already operating at a normal operating threshold (e.g., the $Vdd_{nom}$) and further action (e.g., system shutdown) may be required to prevent data loss. If the method 1000 reaches the system warning at block 1060, this may indicated that sensor cells 150 have continued to fail despite increases in the Mx rail 402 voltage supply (Vdd).

In certain embodiments, environmental conditions (e.g., temperature) may periodically change. This may be affected by certain processes or process variations within the system. Accordingly, the method 1000 may be reset or conducted continuously as the DRV of the bitcell replicas 300 varies according to the environment. Changes in the DRV of the bitcell replicas 300 are indicative of similar changes in the DRV of the memory bitcells 200 within the SRAM modules 140. Accordingly, as read/write and other system operations are conducted or as the environment changes within the SRAM modules 140 sensor indications 506 may drive continuous iterations of the method 1000 to minimize leakage power dissipation.

The method 1000 for optimizing the Mx rail supply voltage Vdd may be modified, for example, by adding, omitting, reordering, or altering steps. Additionally, some steps may be performed concurrently.

Although embodiments of the invention are described above for particular embodiments, many variations of the invention are possible. For example, the numbers of various components may be increased or decreased, modules and steps that determine a supply voltage may be modified to determine a frequency, another system parameter, or a combination of parameters. Additionally, features of the various embodiments may be combined in combinations that differ from those described above.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block or distributed across to modules or blocks without departing from the invention.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. An apparatus for optimizing a memory rail voltage supplied to a plurality of memory bitcells, the memory bitcells of the plurality of memory bitcells configured to retain a memory value when a memory rail voltage is above a first data retention voltage, comprising:
   a plurality of sensor cells, each sensor cell comprising at least one bitcell replica having a predefined data retention voltage and configured to provide an output based on a sensor rail voltage, each sensor cell configured to provide a sensor indication comprising the output of the at least one bitcell replica;
   a power management circuit operably coupled to the plurality of sensor cells and configured to provide the memory rail voltage and the sensor rail voltage; and
   a controller operably coupled to the power management circuit and to the plurality of sensor cells, the controller configured to:
      compare an expected value to the sensor indication of one or more of the plurality of sensor cells; and decrease the sensor rail voltage and the memory rail voltage when the sensor indication matches the expected value.

2. The apparatus of claim 1, wherein the controller is further configured to decrease the memory rail voltage and the sensor rail voltage until at least one sensor indication does not match the expected value.

3. The apparatus of claim 1, wherein the controller is further configured to
bypass a sensor cell of the plurality of sensor cells when the sensor indication does not match the expected value, indicating a bitcell replica failure; and
monitor the remaining sensor cells of the plurality of sensor cells for additional failures.

4. The apparatus of claim 3, wherein the controller is further configured to increase the memory rail voltage and the sensor rail voltage when the output of the plurality of sensor cells does not match the expected value.

5. The apparatus of claim 1, wherein the controller is further configured to adjust the memory rail voltage to a level equal to a maximum data retention voltage of a highest data retention voltage of the plurality of memory bitcells.

6. The apparatus of claim 1, wherein the sensor indication comprises a combination of a plurality of outputs of a plurality of bitcell replicas, the sensor indication being sensitive to a single output.

7. The apparatus of claim 1, wherein the output is indicative of an ability of the at least one bitcell replica to retain a binary memory value.

8. The apparatus of claim 1, wherein the predefined data retention voltage is higher than the first data retention voltage, such that the at least one bitcell replica will fail at a higher memory rail voltage than the memory bitcells.

9. The apparatus of claim 1, wherein the at least one bitcell replica is further configured to have a data retention sensitivity to at least one of process and temperature, the data retention sensitivity further being similar to that of the memory bitcells.

10. The apparatus of claim 1, wherein the memory rail and the sensor rail have a common power supply circuit controlled by the controller.

11. The apparatus of claim 1, wherein the controller is further configured to transmit a system warning when the memory rail voltage is at a nominal supply voltage and the output of the sensor cell and the expected value do not match.

12. The apparatus of claim 1, wherein the expected value is indicative of a value of an output of a bitcell replica that is receiving a sensor rail voltage greater than the predefined data retention voltage.

13. A method for optimizing a memory rail voltage supplied to a plurality of memory bitcells, the plurality of memory bitcells configured to retain a memory value when a memory rail voltage is above a first data retention voltage, the method comprising:
providing a memory rail voltage to the plurality of memory bitcells and a sensor rail voltage to a sensor cell, the sensor cell comprising at least one bitcell replica having a predefined data retention voltage, the sensor cell being configured to provide a sensor indication, the sensor indication indicating an output of the at least one bitcell replica, the output based on the sensor rail voltage;
receiving a sensor indication from the sensor cell;
comparing an expected value to the sensor indication; and
decreasing the sensor rail voltage and the memory rail voltage when the sensor indication matches the expected value.

14. The method of claim 13 further comprising decreasing the memory rail voltage and the sensor rail voltage until at least one sensor indication does not match the expected value.

15. The method of claim 13 further comprising:
bypassing the sensor cell when the sensor indication does not match the expected value, indicating a bitcell replica failure; and
monitoring one or more other sensor cells of a plurality of sensor cells for additional failures.

16. The method of claim 15 further comprising increasing the memory rail voltage and the sensor rail voltage when the sensor indication does not match the expected value.

17. The method of claim 13 further comprising adjusting the memory rail voltage to a level equal to a maximum data retention voltage of a highest data retention voltage of the plurality of memory bitcells.

18. The method of claim 13 further comprising concatenating a plurality of outputs of the at least one bitcell replica within each sensor cell, the sensor indication being sensitive to a single output, wherein the at least one bitcell replica comprises two or more bitcell replicas.

19. The method of claim 13, wherein the output is indicative of an ability of the at least one bitcell replica to retain a binary memory value.

20. The method of claim 13, wherein the predefined data retention voltage is higher than the first data retention voltage, such that the at least one bitcell replica will fail at a higher memory rail voltage than the plurality of memory bitcells.

21. An apparatus for optimizing a memory rail voltage supplied to a plurality of memory bitcells, the memory bitcells configured to retain a memory value when a memory rail voltage is above a first data retention voltage, comprising:
a plurality of means for sensing an ability of one or more memory bitcells of the plurality of memory bitcells to retain a memory value, each means for sensing configured to provide an indication based on a sensor rail voltage;
a means for managing power operably coupled to the plurality of means for sensing and configured to provide the memory rail voltage and the sensor rail voltage; and
a means for controlling operably coupled to the means for managing power and to the plurality of means for sensing, the means for controlling configured to:
compare an expected value to the indication of one or more of the plurality of means for sensing, and
decrease the sensor rail voltage and the memory rail voltage in voltage increments until one of the outputs of the plurality of sensing means does not match the expected value.

22. The apparatus of claim 21, wherein the means for sensing comprises a plurality of sensor cells, each sensor cell comprising at least one bitcell replica having a predefined data retention voltage and configured to provide an output based on the sensor rail voltage, and wherein the indication comprises the output of the at least one bitcell replica.

23. The apparatus of claim 21, wherein the means for managing power comprises a power management circuit and the means for receiving and the means for comparing comprise at least one controller.

24. The apparatus of claim 21, wherein the means for controlling is further configured to:
bypass at least one sensing means of the plurality of sensing means when the indication does not match the expected value; and
monitor the remaining sensing means.

25. The apparatus of claim 21, wherein the means for controlling is further configured to increase the memory rail voltage and the sensor rail voltage when the output of the plurality of means for sensing does not match the expected value.

26. An apparatus for optimizing a memory rail voltage comprising:
  a plurality of sensor cells, each sensor cell comprising at least one bitcell replica, each bitcell replica having a predefined data retention voltage higher than a data retention voltage of a similar memory bitcell, each sensor cell configured to provide a sensor indication comprising an output of the at least one bitcell replica, the output being based on a sensor rail voltage;
  a sensor rail power management circuit operably connected to each sensor cell and configured to supply the sensor rail voltage;
  a memory rail power management circuit operably connected to each memory bitcell of a plurality of memory bitcells and configured to supply the memory rail voltage; and
  a controller operably connected to the sensor rail and memory rail power management circuits and configured to:
    compare each of the sensor indications to an expected value,
    decrease the memory rail voltage and sensor rail voltage in voltage increments until one sensor indication does not match the expected value, indicating that at least one bitcell replica has failed,
    bypass one or more failed sensor cells,
    monitor the bitcells that have not failed, and
    increase the memory rail voltage and sensor rail voltage by at least one increment if additional sensor cells fail and if the rail voltages are less than a maximum nominal value (Vddnom).

27. The apparatus of claim 26, wherein the controller is further configured to adjust the memory rail voltage to a level equal to a maximum data retention voltage of a highest data retention voltage of the plurality of memory bitcells.

28. The apparatus of claim 26, wherein the sensor indication comprises a combination of a plurality of outputs of a plurality of bitcell replicas, the sensor indication being sensitive to a single output.

29. The apparatus of claim 26, wherein the at least one bitcell replica is further configured to have a data retention sensitivity to at least one of process and temperature, the data retention sensitivity further being similar to that of the memory bitcells.

30. The apparatus of claim 26, wherein the controller is further configured to transmit a system warning when the memory rail voltage is at a nominal supply voltage and the output of the sensor cell and the expected value do not match.

* * * * *